(12) United States Patent
Hoyenski, III

(10) Patent No.: US 8,605,395 B1
(45) Date of Patent: Dec. 10, 2013

(54) DUAL PLUG ADAPTER AND HOUSEHOLD HIGH CURRENT APPARATUS

(76) Inventor: Charles James Hoyenski, III, Austin, TX (US)

(*) Notice: Subject to any disclaimer, the term of this patent is extended or adjusted under 35 U.S.C. 154(b) by 137 days.

(21) Appl. No.: 12/931,174

(22) Filed: Jan. 26, 2011

Related U.S. Application Data

(60) Provisional application No. 61/336,882, filed on Jan. 28, 2010.

(51) Int. Cl.
*H02H 3/16* (2006.01)

(52) U.S. Cl.
USPC .............................................. 361/42; 361/44

(58) Field of Classification Search
USPC ..................................................... 361/42–50
See application file for complete search history.

(56) References Cited

U.S. PATENT DOCUMENTS

| | | | |
|---|---|---|---|
| 7,385,473 B2 | 6/2008 | Fabian | |
| 7,501,926 B2 | 3/2009 | Watchorn | |
| 2003/0086225 A1* | 5/2003 | Chaudhry et al. | 361/91.1 |
| 2010/0141038 A1* | 6/2010 | Chapel et al. | 307/64 |
| 2010/0141040 A1* | 6/2010 | Chapel et al. | 307/80 |

* cited by examiner

Primary Examiner — Danny Nguyen

(57) ABSTRACT

The adapter is a circuit that allows the combination of two plugs on a standard duplex receptacle to be connected to a single electrical load. Each plug's hot and neutral outputs are controlled by a single throw electrical switch that is actuated by it's control input being transversely wired in parallel to the other plug. This arrangement doubles the connection's surface contact area since four prongs are used instead of two, thereby lowering the electrical resistance and increasing the current capacity. It has circuit protective devices wired in series between the hot output of each plug and the input of it's corresponding electrical switch. The circuit will not power up if a short, open or miss wired condition is encountered.

17 Claims, 1 Drawing Sheet

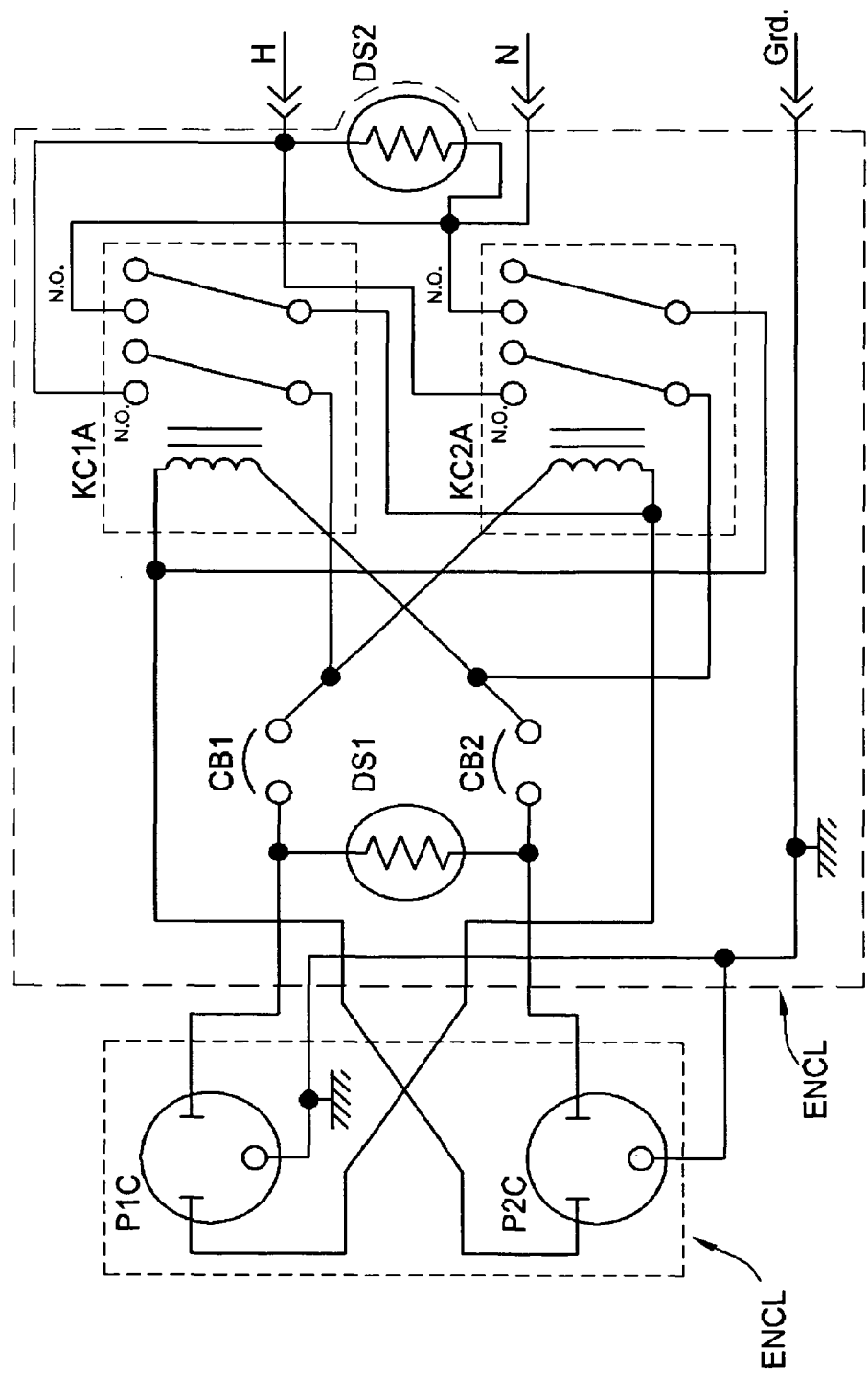

DUAL PLUG ADAPTER AND HOUSEHOLD HIGH CURRENT APPARATUS

CROSS REFERENCE TO RELATED APPLICATIONS

This application claims the benefit of PPA Ser. No. 61/336,882 filed on Jan. 28, 2010 by myself, Charles Hoyenski, which is incorporated by reference.

FEDERALLY SPONSORED RESEARCH

NONE

SEQUENCE LISTING OR PROGRAM

NONE

BACKGROUND OF THE INVENTION

Field

The invention falls into the broad category of electrical adapters in the field of circuit protected devices in general, and plug receptacle connections for power conduction in particular.

Traditional power cords, when used in high current applications can become warm and, in some cases, even extremely hot. When a plug is inserted into a receptacle, it can overheat becoming a safety hazard.

My own experience occurred with a large air conditioner on a recreational vehicle which was being powered with an adapter cord going from a 30 amp plug to a standard NEMA 5-20 amp household receptacle. The adapter in question heated up to the point that it was too hot to touch by hand. When the load was distributed over two plugs instead of one on a standard Edison dual outlet receptacle, the plugs were no longer even a slightly warm.

However, when this twin plug was inserted into a split phase receptacle the house circuit breakers tripped and therefore the circuits shown herein were devised to deal with this sort of problem.

The device described also checks for incorrect polarity at the wall socket. I experienced this situation when using a two conductor polarized extension cord. The hot and neutral prongs were incorrectly swapped when it was manufactured at the factory. This caused an appliance to short to ground and trip circuit breakers. The appliance, a small refrigerator, had a metal chassis that was now wired to the hot lead of the wall socket instead of being grounded, thus it was hot relative to ground.

The neutral and ground leads in most houses and buildings are tied at a common connection point at the main step down transformer coming from the utility company. Thus, if someone were to touch such an exposed bare metal part that was mistakenly grounded on the hot lead, they would risk the danger of a shock. One could complete a circuit if, when touching the bare metal that was incorrectly grounded, they also touched a properly grounded device. For example, a metal sink or pipe could cause such a shock. The Dual Plug Household High Current Apparatus prevents this by detecting these errors and not powering up if one of the plug outlets has a swapped hot and neutral wire pair.

Normally circuit protection devices such as circuit breakers or fuses for example, trip or open the circuit when overload or high current conditions are encountered. In most instances these are sufficient. In ordinary circumstances, these protective devices prevent dangerous overheating of the plug due to excessive current being drawn through it.

However, if there is poor conduction at the point of contact between the plug and the socket due to a variety of possible factors such as corrosion, misshapen contacts or wear, the plug can still overheat. This can occur without the protective device such as a breaker or fuse, tripping or blowing. This can also create a possibly dangerous thermal runaway condition. One way of mitigating this problem is by encompassing the plug conductors with a substantial amount of insulating material. This does result in more of the heat being diffused from the prong conductors in the plug to the plug insulator. Nonetheless, even a plug of this kind can get extremely hot if the maximum rated current is imposed on it over a long period of time. One other method to deal with this problem is to detect a high temperature within the receptacle itself instead of the plug. When this type of device opens the circuit, no further heat is produced at the plug and socket junction. The U.S. Pat. No. 7,385,473 by Fabian Jun. 10, 2008 does address this problem, however, when the circuit detects the overheated condition, it opens up irrevocably and it cannot be reset. The unit then must be repaired or replaced. This aforementioned problem is fixed in U.S. Pat. No. 7,501,926 B2 by Watchhorr Mar. 10, 2009.

However, both Watchorr and Fabian's methods do not solve the overheating problem. What is required is to provide a safe connection for high current devices so that the excessive heat would not be produced in the first place.

SUMMARY

In accordance with the embodiment as set forth in FIG. 1, the device is a fail safe circuit. It prevents thermal overload by creating an open circuit condition. In the event of current overload or a defective plug contact, it interrupts the circuit. It accomplishes this by diffusing the heat created by the electrical contacts, via multiple inputs. Thus a plurality of plug connections, instead of a single one, is used. The device prevents possible overheating and, in the case of extreme heat, combustible fire situations. This situation could be encountered if the electrical insulators were ever to reach the condition known as thermal runaway. An output is present as a voltage only when there is complete continuity. In addition, a uniform voltage and current must exist across both pairs of input plug wires that originate from the two plugs, for it to turn on.

DRAWINGS

Figures

FIG. 1 is an embodiment utilizing an optional grounded input and output. It has two optional incandescent indicators for fault and power on conditions respectively. Circuit breakers and relays are used in this drawing.

DETAILED DESCRIPTION

FIG. 1 shows the embodiment that is presently envisioned for the device. The result desired is a reduction of heat at the input or plug connection. In FIG. 1, the input power to the device is provided by plugs referenced as electrical connectors P1C and P2C.

In this instance the plugs are the armored or metal clad type, that are secured to a metal enclosure. The ground along with the two conductors from each plug are routed through the enclosure via a five conductor power cord. The cord goes into an other enclosure that is also grounded by the same wire coming from the plugs. Alternatively, the plugs could be made of injection molded plastic. It could be formed together as one component along with the cord being fused into the plug molded part. By fabricating it this way no enclosure is needed for the plug and hence, one ground termination could be eliminated. The plugs could also be built into and integral to the unit itself. This would also eliminate the need for a plug enclosure and a five conductor cord.

The plugs are wired to the over voltage protective components identified as circuit breakers CB1 and CB2. In addition, their hot leads are wired in parallel to indicator DS1. This lamp is optional as is DS2 along with the grounding wires and enclosures.

The hot and neutral wires of P1C go to the common side of each pole on the double pole single throw relay KC1A. This wire pair is used to energize the coil for relay KC2A. The hot and neutral wires of P2C are wired to the common side of each pole of an electrical switching device. This device, also a double pole single throw relay, is shown as KC2A. This wire pair from P2C, is also used to energize the coil of relay KC1A. Both relays are of the normally open type abbreviated as N.O. This means they do not complete a circuit until their coils are energized. The voltage potential at these coils is equivalent to the voltage present at each plug and the voltage at power on indicator DS2.

Operation

As shown in the embodiment of FIG. 1, the device in normal use is plugged into a standard wall outlet. This could be a standard outlet with two plugs per receptacle, or it could be plugged into two different outlets providing the plugs were separated and on cords, so that each could reach the receptacle nearest to it. These receptacles can be found internally or externally in any building, home or other edifice equipped with standard household current. If an over voltage condition occurred due to each of the plug hot lines using a different phase on it's input, the voltage across the two hot lines would be double what is normally expected across the hot and neutral leads respectively.

It also has over current protective devices identified as circuit breakers CB1 and CB2. Since the relays normally switch the plug lines together in parallel when they close, either CB1 or CB2, or possibly both, would interrupt the circuit. This doubled potential across the two hot leads at the plugs would cause the fault indicator lamp DS1 to light up. This indicates an over current or over voltage error and the output would be cut off. The open circuit would be due to the tripped or interrupted state of CB1 or CB2 or both.

In normal household wiring, the neutral lead is wired in common to both plugs in the receptacle. In such an arrangement, protective devices like fuses or circuit breakers are wired on the hot side. They are placed in series with a given hot line at the main junction box of the facility. Usually, the hot side of both outlets is also wired in parallel at the receptacle as well. However, in certain applications where many high current electrical devices are used, electricians will sometimes wire two different hot or phase wires into the same receptacle. This results in one plug with an output that is out of phase with the other. This also creates a potential across the hot leads that is twice that between the hot and neutral lines of each plug. In this situation, both plugs share the same neutral or center tap at the transformer, but their hot lines are at opposite ends of the secondary step down winding, giving rise to the two phase condition at the receptacle outlet. There would otherwise have been zero voltage potential across the hot leads had they come from the same phase tap on the transformer.

Thus, in the case of independent hot circuits provided to each plug in a two plug receptacle, the voltage across the hot leads is exactly twice that of the voltage across each plugs hot and its respective neutral leads. The device when plugged in, will check for this condition and will safely shut down when it is encountered.

When a receptacle is conventionally wired as a standard circuit, the hot conductor is wired in parallel to each plug outlet in it. The voltage potential across the two hot leads is zero The device will turn on and operate in a normal fashion permitting the power of both plugs to flow through it as a combined single output. An additional requirement that must be met before the device will provide an output, is that all four input conductors on the plugs or the prongs, as they are called, must be securely inserted into the receptacles two outlets. If any one of the plug contacts is loose, open or makes an intermittent contact, the unit will also not power up. A load imbalance caused by faulty wiring will also cause it to not power up. This is due to one of the circuit protective devices opening up on the overloaded side of the circuit. The device will turn off to prevent overheating of any of the two plugs due to current overload. If an open circuit condition exists in any of the four input conductors, the electrical switch controlling that circuit will not energize. This means that the contacts will stay open and no output will be present. This prevents all the current from being routed to a single pair of conductors in just one plug. Both plugs divide the current through the circuit. This prevents either circuit from bearing too much of the load and overheating.

Power is only allowed to go forward through it as a unified output. It is not possible to energize the electrical switching devices from the output or combined end of the circuit. This can only be done from the input connection points of the plugs show in FIG. 1. This effectively isolates both plugs and the device from whatever they are powering when they are not energized. This is a useful feature if the device is being used to power anything that could hold possible capacitive charges or backwards flowing electro magnetic force when turned off.

CONCLUSION, RAMIFICATIONS, AND SCOPE

It will be apparent to the reader that, according to the embodiment I have provided in the description of FIG. 1, containing many specificity's, it should not be construed as being limited in scope by these specificity's. For example, it can be used in an ungrounded circuit and built into a non metallic housing for an appliance such as a heater, industrial machinery, etc. The device also could be part of a grounded circuit and built into an enclosure or housing of a machine or appliance such as a large air conditioner. It could even be built as a stand alone adapter cord used to hook up larger appliances. It could also could be used as a charge cord for an electric car or a shoreline cord for a recreational vehicle. Any device requiring a high household current input, could use the household high current apparatus.

Also, it is possible to use other methods of powering the contactor coils. For example, transformers could be center tapped on the secondary side with a diode at each end providing half wave rectification for a lower direct current control voltage. Though this is not as smooth a form of rectification as the full, or four diode bridge, it nonetheless could power contactors and light emitting diodes instead of the incandescent lamp shown in FIG. 1. Also, the use of off the shelf type switch mode power supplies would work just as well. In addition, instead of contactors or relays, solid state relays or silicon controlled rectifiers could be substituted using this control voltage. In theory, even vacuum tubes could be used to perform the same electrical switching function.

An optional set of status indicators could also be added to alert the user of the current state of the circuits being used when illuminated. These indicators could include but are not limited to neon, incandescent, light emitting diodes and liquid crystal display-type lamps and indicators. The circuit interrupters, when tripped, could also pop out or display a warning using a mechanical means of actuation.

The protective devices need not be limited to fuses and circuit breakers; metal oxide varistors, tranzorbs, zener diodes, and thermal or magnetic interrupters could be employed as well. One of the unexpected results, encountered in a prototype, was that both internal circuit protectors of the device tripped. This occurred due to two different phase or hot leads being wired into each plug of the receptacle under test. However, just a single circuit protection device would have sufficed to cut off power.

Furthermore, it has advantages:

In the event of miss wiring, it will safely shut off if neutral and hot wires are reversed.

If any of the hot or neutral lines are not completely connected, it detects an open circuit condition and will not power up.

It will detect an imbalance of load on either plug circuit and shut off preventing an overload condition.

It prevents overheating of the plug and receptacle by distributing the load over a dual pair of conductors and plugs instead of a single plug.

It only allows power to go only in one direction, from the plugs to the output, thereby preventing load devices that might store capacitive charges or emf from sending power back out to the exposed prongs of the plugs when unplugged.

It allows the maximum amount of power to be drawn safely from a household receptacle with two sockets in it.

In the event of faulty wiring or defective circuit breakers within the building, it provides a second level of protection. The built in over current and over voltage protective devices will shut down an appliance if the building does not also have such devices or if they do not function properly and a short is encountered.

Thus, the scope of the invention should be determined by the appended claims and their legal equivalents, and not by the example given.

The invention claimed is:

1. An electrical apparatus comprising:
    a set of power input connectors having one hot and one neutral wire per pair whereby one hot conductor of each pair is wired in series to an over current protective device and the other neutral conductor of each said hot and neutral pair is wired to the common side of a two pole electrically actuated switch;
    two pairs of said electrically actuated switches selected from the group containing mechanical relays, solid state relays and contactors, said electrical switches having two poles each, in the normally open position, with each pair wired to the hot and neutral input leads of said hot overcurrent protective devices and neutral input connection points and are also transversely wired across each others respective control inputs;
    a set of said overcurrent and overvoltage protective devices selected from the group containing circuit breakers and fuses, said devices are wired in series between one conductor of each input connector and one pole of each electrical switch, whereby power can be drawn from an alternating current source at or near it's maximum rated current capacity using an input of two electrical connector pairs instead of one before combining the output into a single pair of conductors for use by an electrical apparatus that is attached as a load to said output pair of conductors;
    a single output connection point selected from the group containing receptacles, sockets, plugs and power connectors made ready for connection to the appliance or device inducing the load.

2. The electrical apparatus of claim 1 wherein said apparatus is encompassed by a grounded conductive enclosure.

3. The electrical apparatus of claim 1 wherein said input connectors are combined as a dual plug assembly.

4. The plugs of claim 3 wherein said plugs are selected from the group containing armored and unarmored insulated plugs along with those that have screw on, lugged, quick disconnect and other mechanical means of securing said plug connection points to the conductors and plastic type plugs comprising insulators formed by means of injection molding with said plugs having integrally bonded connections to conductors fabricated into a unified cord assembly.

5. The plugs of claim 3 wherein said plugs are attached to a five conductor electrical cord comprised of two neutral conductors, two hot conductors and one ground conductor.

6. The plugs of claim 3 wherein said plugs conform to the 5-15 type industry standard as set forth by the National Electrical Manufacturers Association of the United States.

7. The electrical apparatus of claim 1 wherein said apparatus is equipped with status indicators to indicate power on and fault conditions.

8. The status indicators of claim 7 wherein said indicators are selected from the group containing light emitting diodes, incandescent lamps, liquid crystal displays, cathode ray tubes and neon gas filled bulbs.

9. The electrical apparatus of claim 1 wherein said apparatus is encompassed by a non conductive enclosure that includes an appliance load connected to the apparatus within said enclosure.

10. The electrical apparatus of claim 1 wherein said input connectors are comprised of two separate plug and cord assemblies.

11. The plugs of claim 10 wherein said plugs each are attached to a two conductor electrical cord comprised of a neutral conductor and a hot conductor.

12. The plugs of claim 10 wherein said plugs conform to the 1-15P type industry standard for polarized plugs as set forth by the National Electrical Manufacturers Association of the United States.

13. The electrical apparatus of claim 1 wherein said apparatus and all connection points are encompassed by a grounded conductive enclosure.

14. The electrical apparatus of claim 1 wherein said input connectors are combined as a dual plug assembly that is integral to the apparatus.

15. The plugs of claim 14 wherein said plugs conform to the 5-20 type industry standard as set forth by the National Electrical Manufacturers Association of the United States.

16. The electrical apparatus of claim 1 wherein said output connection point is a three conductor Grounded receptacle.

17. The receptacle of claim 16 wherein said receptacle conforms to the TT-30R type industry standard as set forth by the National Electrical Manufacturers Association of the United States.

* * * * *